(12) United States Patent
Itagaki et al.

(10) Patent No.: US 8,212,248 B2
(45) Date of Patent: Jul. 3, 2012

(54) AMORPHOUS OXIDE AND FIELD EFFECT TRANSISTOR

(75) Inventors: Naho Itagaki, Fukuoka (JP); Amita Goyal, Tokyo (JP); Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 83 days.

(21) Appl. No.: 12/742,977

(22) PCT Filed: Dec. 25, 2008

(86) PCT No.: PCT/JP2008/073924
§ 371 (c)(1),
(2), (4) Date: May 14, 2010

(87) PCT Pub. No.: WO2009/087943
PCT Pub. Date: Jul. 16, 2009

(65) Prior Publication Data
US 2010/0276685 A1    Nov. 4, 2010

(30) Foreign Application Priority Data

Jan. 8, 2008 (JP) .................................. 2008-001336

(51) Int. Cl.
*H01L 29/10* (2006.01)

(52) U.S. Cl. ...................... 257/43; 257/57; 257/E29.296

(58) Field of Classification Search .................... 257/43, 257/57
See application file for complete search history.

(56) References Cited

U.S. PATENT DOCUMENTS

| | | | |
|---|---|---|---|
| 5,804,473 A | 9/1998 | Takizawa | 438/166 |
| 6,646,285 B1 | 11/2003 | Kagan et al. | 257/40 |
| 6,689,477 B2 * | 2/2004 | Inoue | 428/432 |
| 7,145,174 B2 | 12/2006 | Chiang et al. | 257/59 |
| 7,189,992 B2 | 3/2007 | Wager, III et al. | 257/43 |
| 7,242,039 B2 | 7/2007 | Hoffman et al. | 257/213 |
| 7,282,782 B2 | 10/2007 | Hoffman et al. | 257/613 |
| 7,297,977 B2 | 11/2007 | Hoffman et al. | 257/43 |
| 7,411,209 B2 | 8/2008 | Endo et al. | 257/43 |
| 7,473,942 B2 | 1/2009 | Iwasaki et al. | 257/103 |
| 2003/0160922 A1 * | 8/2003 | Noritake | 349/113 |
| 2005/0062134 A1 | 3/2005 | Ho et al. | 257/614 |
| 2006/0108636 A1 | 5/2006 | Sano et al. | 257/347 |
| 2006/0118406 A1 | 6/2006 | Delahoy et al. | 204/192.12 |
| 2006/0244107 A1 | 11/2006 | Sugihara et al. | 257/646 |

(Continued)

FOREIGN PATENT DOCUMENTS

CN    101669210 A    3/2010

(Continued)

OTHER PUBLICATIONS

K. Nomura et al., "Room-temperature fabrication of transparent flexible thin-film transistors using amorphous oxide semiconductors," Nature, vol. 432, pp. 488-492, Nov. 25, 2004.

(Continued)

*Primary Examiner* — Marcos D. Pizarro
*Assistant Examiner* — Bilkis Jahan
(74) *Attorney, Agent, or Firm* — Fitzpatrick, Cella, Harper & Scinto

(57) ABSTRACT

An amorphous oxide at least includes: at least one element selected from the group consisting of In, Zn, and Sn; and Mo. An atomic composition ratio of Mo to a number of all metallic atoms in the amorphous oxide is 0.1 atom % or higher and 5 atom % or lower.

21 Claims, 7 Drawing Sheets

U.S. PATENT DOCUMENTS

| | | |
|---|---|---|
| 2006/0270197 A1 | 11/2006 | Ho et al. .................. 438/478 |
| 2007/0015029 A1* | 1/2007 | Budinski et al. ............... 429/34 |
| 2007/0071985 A1* | 3/2007 | Kumar et al. ................ 428/432 |
| 2007/0194379 A1 | 8/2007 | Hosono et al. ............... 257/347 |
| 2008/0012016 A1* | 1/2008 | Inoue et al. .................. 257/59 |
| 2008/0203387 A1 | 8/2008 | Kang et al. .................. 257/43 |
| 2009/0065771 A1 | 3/2009 | Iwasaki et al. ............... 257/43 |
| 2009/0134427 A1 | 5/2009 | Oike et al. .................. 257/103 |
| 2009/0174012 A1 | 7/2009 | Iwasaki ..................... 257/410 |
| 2009/0189153 A1 | 7/2009 | Iwasaki et al. ............... 257/43 |
| 2009/0269880 A1 | 10/2009 | Itagaki et al. ............... 438/104 |
| 2010/0092800 A1 | 4/2010 | Itagaki et al. ............... 438/697 |
| 2010/0109002 A1 | 5/2010 | Itagaki et al. ............... 257/43 |
| 2010/0117085 A1* | 5/2010 | Lee ........................... 257/57 |

FOREIGN PATENT DOCUMENTS

| | | |
|---|---|---|
| JP | 2002-076356 A | 3/2002 |
| JP | 2008-219008 A | 9/2008 |
| WO | WO 2008/133457 A1 | 11/2008 |

OTHER PUBLICATIONS

B. Yaglioglu et al., "High-mobility amorphous $In_2O_3$-10 wt % ZnO thin film transistors," Applied Physics Letters, vol. 89, pp. 062103-1-062103-3, Aug. 7, 2006.

P. Barquinha et al., "Effect of UV and visible light radiation on the electrical performances of transparent TFTs based on amorphous indium zinc oxide," Journal of Non-Crystalline Solids, vol. 352, pp. 1756-1760, Apr. 18, 2006.

G. Lavareda et al., "Transparent thin film transistors based on indium oxide semiconductor," Journal of Non-Crystalline Solids, vol. 352, pp. 2311-2314, May 23, 2006.

E. Elangovan et al., "Preliminary studies on molybdenum-doped indium oxide thin films deposited by radio-frequency magnetron sputtering at room temperature," Thin Solid Films, vol. 515, pp. 5512-5518, Jan. 23, 2007.

* cited by examiner

AMORPHOUS OXIDE AND FIELD EFFECT TRANSISTOR

TECHNICAL FIELD

The present invention relates to an amorphous (also known as non-crystalline) oxide and a field effect transistor in which such an amorphous oxide is used for an active layer. The present invention also relates to a display apparatus in which organic EL or inorganic EL using such a transistor is used as a light-emitting device and to a display apparatus in which liquid crystal using such a transistor is used.

BACKGROUND ART

In recent years, semiconductor devices which use an amorphous-oxide-based semiconductor thin film have been receiving attention. Such a semiconductor thin film can be formed at low temperature, and has a large optical band gap and is optically transparent to visible light. Hence, a flexible transparent thin film transistor (TFT) or the like can be formed on a plastic substrate, a film substrate, or the like.

As an example, Japanese Patent Application Laid-Open No. 2002-76356 discloses a technology with regard to a TFT in which an oxide film mainly formed of Zn—O is used as an active layer.

"Nature", Vol. 432, 25, November 2004 (pp. 488-492) discloses a technology with regard to a TFT in which a non-crystalline oxide film formed at room temperature and containing indium, zinc, and gallium is used as an active layer. The S value of the TFT is about 2 V/decade, which is relatively large, but the field-effect mobility of the TFT is as high as 6 to 9 $cm^2/Vs$, and thus, its application to an active matrix system which is desired to be used in a flat panel display apparatus using liquid crystal, electroluminescence, or the like is expected.

"Journal of Non-Crystalline Solids" 352 (2006) 2311 discloses that an oxide thin film formed at room temperature and mainly formed of indium oxide is used as a channel layer (active layer) of a TFT. Depending on the material of a gate insulating film, the field-effect mobility of the TFT is 10 to 140 $cm^2/Vs$ and the S value of the TFT is 0.09 to 5.6 V/decade.

United States Patent Application Publication No. 2006/0108636 discloses a technology with regard to addition of an impurity such as Li, Na, Mn, Ni, Pd, Cu, Cd, C, N, or P to an active layer of a TFT in which an amorphous oxide film formed at room temperature and containing indium, zinc, and gallium is used as an active layer. In this way, by adding an impurity element in the active layer, the carrier density is controlled, and as a result, a TFT with a large current on/off ratio is thought to be obtained.

However, according to findings by the inventors of the present invention, the TFT disclosed in "Nature", Vol. 432, 25, November 2004 (pp. 488-492) has a problem that, depending on the atomic composition ratios of the metallic elements mainly forming the non-crystalline oxide film used as the active layer, the TFT characteristics vary greatly.

With regard to the TFT disclosed in United States Patent Application Publication No. 2006/0108636, the effect of adding an impurity when the atomic composition ratios of the metallic elements mainly forming the active layer are changed is not clarified.

With regard to "Journal of Non-Crystalline Solids" 352 (2006) 2311, according to findings by the inventors of the present invention, the environmental stability of the In—O film formed at room temperature is low, and the resistivity of the In—O film varies greatly when the In—O film is left in an atmosphere. For example, when the film is left in an atmosphere at a temperature of 20° C. and at a humidity of 50% for a month, the resistivity is observed to decrease by one or two orders of magnitude. Further, the above-mentioned decrease in resistivity is similarly observed in the oxide semiconductor disclosed in Japanese Patent Application Laid-Open No. 2002-76356 mainly formed of Zn—O.

DISCLOSURE OF THE INVENTION

The present invention has been made in view of the above-mentioned problems. Therefore, an object of the present invention is to provide an amorphous oxide and a field-effect TFT which have excellent transistor characteristics including an excellent field-effect mobility and an excellent S value, excellent environmental stability, and a high margin of atomic composition ratios (degree of freedom of design).

The present invention provides an amorphous oxide, at least comprising: at least one element selected from the group consisting of In, Zn, and Sn; and Mo, and in the amorphous oxide, an atomic composition ratio of Mo to a number of all metallic atoms in the amorphous oxide is 0.1 atom % or higher and 5 atom % or lower.

Further, the present invention provides a field effect transistor, at least comprising: a drain electrode; a source electrode; a gate electrode; an active layer; and a gate insulating film, and in the field effect transistor, the active layer comprises the amorphous oxide.

Further, the present invention provides a display apparatus, comprising: a display device having an electrode; and the field effect transistor, one of the source electrode and the drain electrode of the field effect transistor being connected to the electrode of the display device.

According to an embodiment of the present invention, the amorphous oxide which has excellent semiconductor characteristics can be obtained. Further, the field effect transistor which has excellent transistor characteristics including an excellent field-effect mobility and an excellent S value, and excellent environmental stability can be provided. Further, the field effect transistor which has a high margin of atomic composition ratios (degree of freedom of design) can be provided, which has the transistor characteristics with little variance depending on the atomic composition ratios of atoms (especially metallic atoms) forming the field effect transistor.

Further features of the present invention will become apparent from the following description of exemplary embodiments with reference to the attached drawings.

BEST MODE FOR CARRYING OUT THE INVENTION

Figure 1:
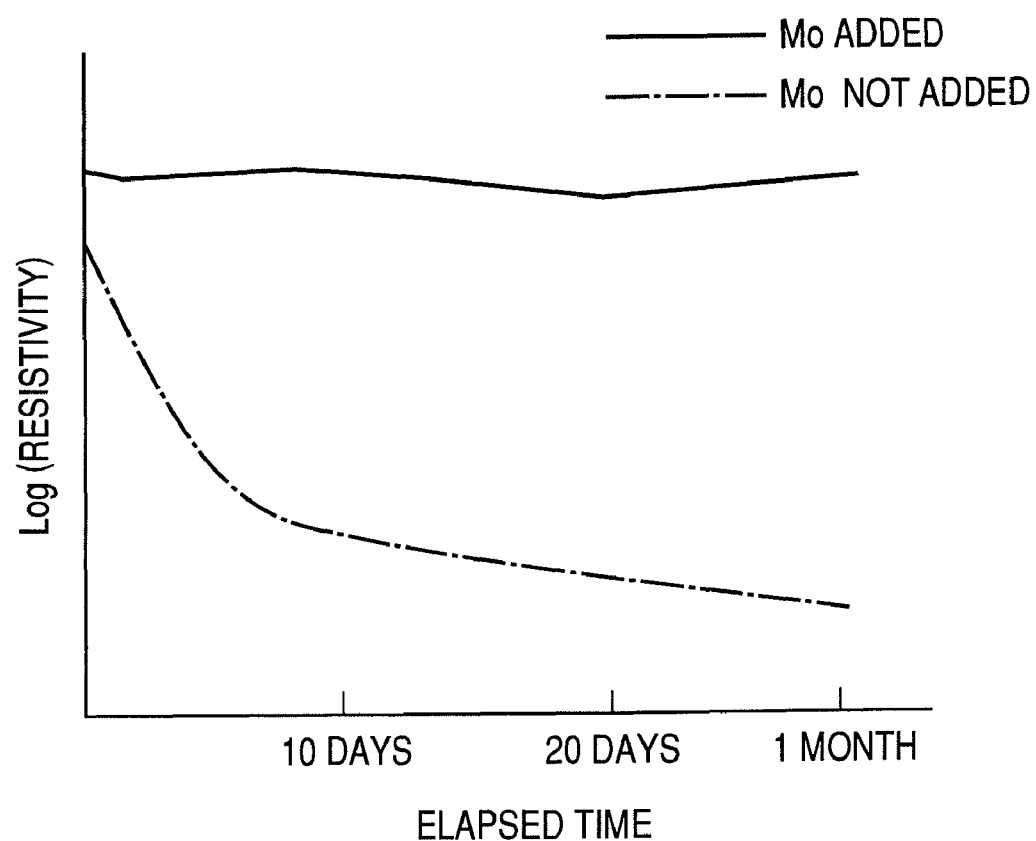
FIG. 1 is a graph illustrating variations over time of resistivity of an oxide film according to an embodiment of the present invention which is left in an atmosphere at a temperature of 20° C. and at a humidity of 50%.

First, findings with regard to the present invention obtained by the inventors of the present invention are described.

"Nature", Vol. 432, 25, November 2004 (pp. 488-492) describes a technology for using an amorphous oxide having an atomic composition ratio of In:Ga:Zn=1.1:1.1:0.9 (atom %) for an active layer of the TFT.

The inventors of the present invention formed an In—Ga—Zn—O film at room temperature by a sputtering method and evaluated its transistor characteristics. It was found that, by making small the atomic composition ratio of Ga, a transistor which had excellent initial characteristics could be obtained. In particular, it was found that, when Ga was not contained in the oxide thin film, a transistor which had a high field-effect mobility and a small S value could be obtained. The S value as referred to herein means a gate voltage value in a sub-threshold region which changes a drain current by one order of magnitude with a constant drain voltage.

On the other hand, a problem was revealed that, when the atomic composition ratio of Ga was made small, a design range of the atomic composition ratios of In and Zn (range of atomic composition ratios applicable to transistor) was made small. For example, when the atomic composition ratio of Ga to the sum of In, Ga, and Zn, Ga/(In+Ga+Zn), was 30 atom %, satisfactory transistor operation was observed when the atomic composition ratio of In to the sum of In and Zn, In/(In+Zn), was 15 atom % or higher and 65 atom % or lower. On the other hand, when the atomic composition ratio of Ga was 0 atom %, the range of the atomic composition ratio of In to the sum of In and Zn when satisfactory transistor operation was observed became smaller in the range of 30 atom % or higher and 55 atom % or lower. It is to be noted that, outside the range of the above-mentioned atomic composition ratio, a phenomenon was caused that relatively large current passed even when negative gate bias was applied, and a current on/off ratio of $10^5$ or higher could not be obtained.

Further, depending on the atomic composition ratio of Ga, the environmental stability of the oxide film itself varies. Variations over time of the resistivity when the oxide film is left at rest in the atmosphere become smaller as the atomic composition ratio of Ga in the film becomes higher. Specifically, from the viewpoint of TFT characteristics, it is preferred that the atomic composition ratio of Ga be low, while, from the viewpoint of environmental stability, it is preferred that the atomic composition ratio of Ga be high.

Therefore, in order to materialize an oxide semiconductor which has both satisfactory characteristics and satisfactory environmental stability, the inventors of the present invention added various kinds of elements to an In—Zn—O film and measured variations over time of the transistor characteristics and the resistivity. As a result, it was found that, by adding a certain atomic composition ratio of Mo, the environmental stability could be improved while the transistor characteristics as good as those of an In—Zn—O film were maintained.

FIG. 1 is a graph illustrating variations over time of the resistivity of the In—Zn—O film which is left in an atmosphere at a temperature of 20° C. and at a humidity of 50%. With regard to the In—Zn—O film with no Mo added thereto, the resistivity was observed to decrease immediately after the film formation. In particular, when the atomic composition ratio of In was 55 atom % or higher and 30 atom % or lower, the environmental stability was low, and, depending on the atomic composition ratio, the resistivity decreased by one order to three orders of magnitude. Although the reason is not clear, it is thought that an excessive amount of a carrier was generated in the film, since the resistivity of the film greatly decreased.

Figure 2:
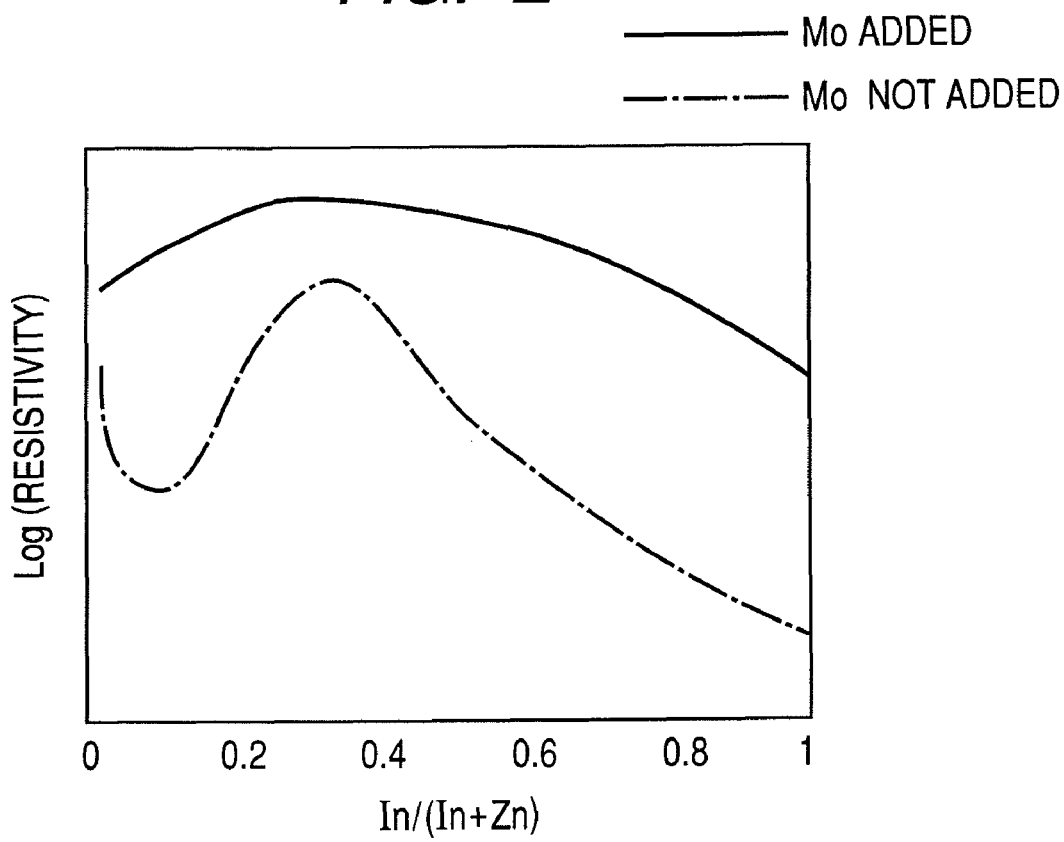
FIG. 2 is a graph of resistivity after variations over time which is plotted against atomic composition ratio of a metal with regard to the oxide film according to the embodiment of the present invention.

On the other hand, with regard to the In—Zn—O film with a minute amount of Mo added thereto, independently of the atomic composition ratio, almost no variation of the resistivity was observed even after the film was left at rest for one month. FIG. 2 is a graph of resistivity after the film was left at rest for one month, which is plotted against atomic composition ratio.

Further, it was made clear that, by adding a minute amount of Mo, the design range of the transistor with respect to atomic composition ratios of In and Zn (range of atomic composition ratios applicable to transistor) became larger. In particular, it was made clear that satisfactory transistor operation was observed when the atomic composition ratio of In to the sum of In and Zn was 30 atom % or higher and 80 atom % or lower.

Review by the inventors of the present invention reveals that, as the resistivity of the oxide semiconductor becomes higher, the off-current becomes lower, and so-called "normally-off characteristics" are exhibited in which current does not flow when a gate voltage is not applied. Therefore, one reason for the above-mentioned enlargement of the design range of the composition by the addition of Mo is thought to be suppression of variations (lowering) over time of the resistance in the In-rich region (In: 55 atom % or higher) in which the environmental stability is low.

Further, experiments by the inventors of the present invention reveal that an amorphous oxide containing at least one element among In, Zn, and Sn has a relatively high carrier mobility but the variations over time of the resistance are large. Therefore, based on the above-mentioned findings, an experiment was carried out in which Mo was added to an amorphous oxide thin film containing at least one element among In, Zn, and Sn. The result was that, by adding a minute amount of Mo, a relatively high carrier mobility was maintained, and still, the variations over time of the resistance could be suppressed.

An embodiment of the present invention is now described in detail with reference to the drawings.

Figure 3:
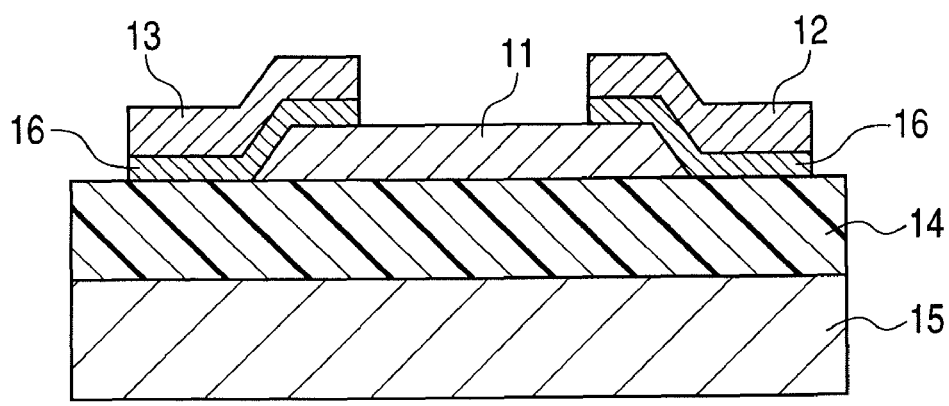
FIG. 3 is a schematic sectional view illustrating an exemplary structure of a thin film transistor as an embodiment of the present invention.

FIG. 3 is a schematic view illustrating a structure of a TFT device according to this embodiment. The TFT is formed by providing a gate insulating film 14 on a gate electrode 15 and providing a source electrode 12 and a drain electrode 13 on the gate insulating film 14. The gate electrode 15 may also serve as a substrate by being formed of, for example, phosphorus doped Si, or may be formed on a substrate such as glass.

Figure 4:
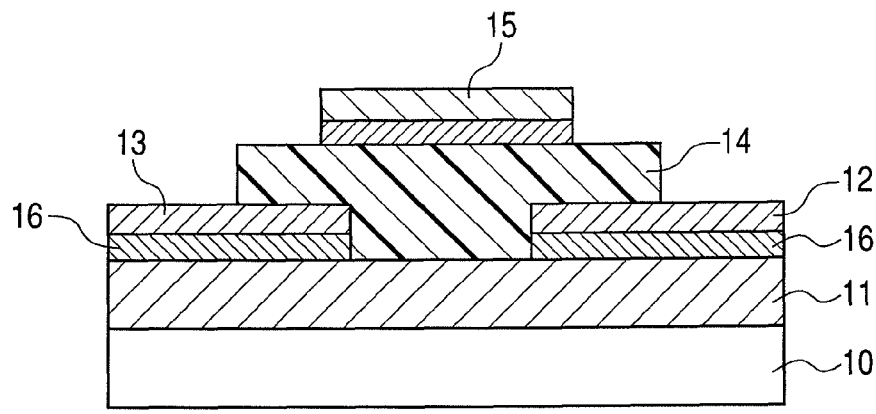
FIG. 4 is a schematic sectional view illustrating an exemplary structure of a thin film transistor as another embodiment of the present invention.

The structure of the semiconductor device applicable to this embodiment is not limited to such an inverted staggered (bottom-gate) structure of the TFT, and may be a staggered structure (top-gate structure) of the TFT in which, for example, a gate insulating film and a gate electrode are provided in this order on an active layer as illustrated in FIG. 4.

As described above, as an active layer (channel layer) 11 of the TFT, an amorphous oxide which contains at least one element among In, Zn, and Sn and also contains a minute amount of Mo is used. In particular, the variations over time of the resistivity of the amorphous oxide are suppressed when the atomic composition ratio of Mo to the number of all metallic atoms in the amorphous oxide is 0.1 atom % or higher, and thus, a TFT which has excellent stability over time can be obtained by using the oxide as the active layer of the TFT.

Figure 5:
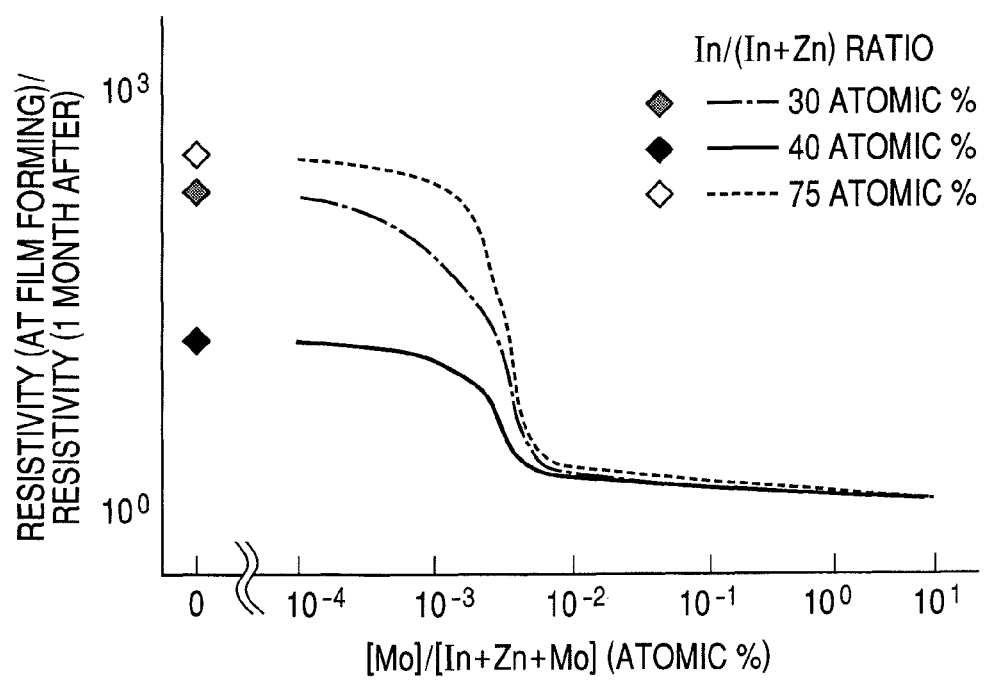
FIG. 5 is a graph of rate of change of the resistivity which is plotted against atomic composition ratio of Mo with regard to the oxide film according to the embodiment of the present invention.

FIG. 5 is a graph of rate of change of the resistivity which is plotted against atomic composition ratio of Mo in the film. Specifically, values calculated by dividing the resistivity immediately after the film formation of the amorphous oxide formed with various atomic composition ratios of Mo by the resistivity after being left at rest in the atmosphere for a month are shown. FIG. 5 makes it clear that there is almost no variation of the resistivity in a film formed of an amorphous oxide in which the atomic composition ratio of Mo is 0.1 atom % or higher.

On the other hand, according to review by the inventors of the present invention, when the atomic composition ratio of Mo to the number of all metallic atoms is too high, it is difficult to obtain a film having a high carrier mobility, and, as a result, satisfactory TFT characteristics cannot be obtained. Specifically, when the atomic composition ratio of Mo to the number of all metallic atoms exceeds 3 atom %, the current on/off ratio becomes less than five-digit numbers, and further, when the atomic composition ratio of Mo to the number of all metallic atoms exceeds 5 atom %, the current on/off ratio becomes less than three-digit numbers. Therefore, the range of the atomic composition ratio of Mo to the number of all metallic atoms is preferably from 0.1 atom % to 5 atom %, and more preferably, from 0.1 atom % to 3 atom %.

The current on/off ratio can be determined from the ratio of the largest current (Id) between the source electrode and the drain electrode to the smallest Id in the transfer characteristics. From the result of the transfer characteristics, a graph of √Id–Vg is prepared, and the field-effect mobility is derived from the slope of the graph.

When the above-mentioned amorphous oxide contains In and Zn, a TFT which has a high field-effect mobility and a small S value with excellent sub-threshold characteristics can be obtained. According to review by the inventors of the present invention, in particular, a TFT which has a high field-effect mobility can be obtained with a film containing a large amount of In, and a TFT which has a small S value can be obtained with a film containing a large amount of Zn. By selecting suitable composition, a transistor which has desired characteristics can be obtained. However, when the atomic composition ratio of Zn to the number of all metallic atoms is higher than 70 atom %, the film becomes polycrystalline and the surface roughness of the film becomes large. When such an oxide thin film is used as the active layer of the TFT, the interface characteristics are lowered. Hence, the field-effect mobility is lowered and the S value becomes larger. Therefore, it is preferred that the atomic composition ratio of Zn to the number of all metallic atoms be 70 atom % or lower. The lower limit of the atomic composition ratio of Zn is not particularly limited insofar as the effect of the present invention is obtained, but, according to findings of the inventors of the present invention, it is preferred that the lower limit be 70 atom %.

It is to be noted that the above-mentioned oxide material may contain Ga so as not to adversely affect other characteristics. Containing Ga has the advantage of being able to control the optical characteristics of the film by the composition ratio of Ga. Specifically, introduction of Ga into the film increases the band gap, and thus, an amorphous oxide which is highly transparent to visible light can be obtained.

Further, in addition to Ga, the above-mentioned oxide may contain other impurities insofar as the impurities do not substantially affect film characteristics including the carrier mobility, the carrier density, and the band gap.

The material for the source electrode 12, the drain electrode 13, and the gate electrode is not particularly limited, so long as the material has good electrical conductance and is capable of electrical connection with the channel layer. For example, a material serving both as a gate electrode and a substrate, like a phosphorus-doped silicon substrate, can be used. Further, a transparent conductive film such as an indium oxide film doped with tin or a zinc oxide, or a metal film of gold, platinum, aluminum, nickel, molybdenum, and the like may also be used. According to review by the inventors of the present invention, when molybdenum is used as the source and drain electrodes, particularly satisfactory TFT characteristics can be obtained. The reason is thought to be that the adhesion and the extent of electrical contact are improved because the same element is used as the active layer and the electrodes. Further, there may be an adhesive layer 16 formed of titanium, nickel, chromium, or the like for improving the adhesion disposed between the active layer and the electrodes, and between the gate electrode and the gate insulating film, but the adhesive layer 16 is not essential.

As the gate insulating film 14, in addition to a silicon oxide film, a silicon nitride film, and a silicon oxynitride film which are usually used, any of an alumina film and an yttria film which have high dielectric constant, and a film formed by lamination thereof may be used.

A glass substrate, a metallic substrate, a plastic substrate, a plastic film, or the like can be used as a substrate 10 formed with each of the above-mentioned films depending on the heat-treatment conditions.

With regard to a method of preparing a TFT active layer according to the present invention, first, a substrate such as a glass substrate, a plastic substrate, a PET film, or an Si substrate is prepared. Then, an oxide semiconductor is formed by a vapor phase method such as a sputtering method, a pulse laser deposition method, or an electron beam deposition method, or a combination thereof. Here, according to the desired electrical resistivity, $O_2$ or the like is introduced in the vapor phase.

Further, according to review by the inventors of the present invention, in a TFT in which an oxide semiconductor thin film is used as the active layer, particularly satisfactory TFT characteristics are obtained when a semi-insulating oxide film which has an electrical resistivity of about 1 Ωcm to 100 kΩcm is used. For example, when the electrical resistivity is lower than 1 Ωcm, the current on/off ratio of the TFT cannot be made large. In extreme cases, even when a gate voltage is applied, current between the source electrode and the drain electrode cannot be switched on/off, and transistor operation is not observed. On the other hand, when the electrical resistivity is higher than 100 kΩcm, the on-current cannot be made large. In extreme cases, even when a gate voltage is applied, current between the source electrode and the drain electrode cannot be switched on/off, and transistor operation is not observed.

Ordinarily, in order to control the electrical resistivity and electron carrier density of an oxide, the partial pressure of oxygen in film formation is controlled. Specifically, by controlling the partial pressure of oxygen, mainly the amount of loss of oxygen in the thin film is controlled to control the electron carrier density. When the film is formed by the sputtering method, typically, by forming the film with the partial pressure of oxygen to be introduced being about 0.001 Pa to 0.01 Pa, a semi-insulating thin film can be obtained.

It is also preferred that, after the above-mentioned process, heat treatment be carried out with respect to the manufactured oxide. The upper limit of the temperature of the heat treatment may be set as appropriate, but is preferably below the glass transition temperature at which heat deformation of the substrate is caused. For example, when the substrate is a glass substrate, it is preferred that the heat treatment be carried out at 450° C. or lower, and, when the substrate is a plastic substrate, it is preferred that the heat treatment be carried out at 200° C. or lower. This makes stable the electrical characteristics of the oxide film, and a more reliable semiconductor device can be materialized. In order to effectively carry out the heat treatment, it is preferred that the atmosphere contain any of oxygen, nitrogen, water vapor, carbon dioxide, ozone, and a nitrogen oxide and the temperature of the atmosphere is 150° C. or higher (the upper limit of the temperature is adjusted to be within the above-mentioned range depending on the substrate to be used). This has an effect that the off-current of the TFT can be made further smaller and the interface characteristics are improved, and thus, the S value can be made smaller.

The TFT characteristics according to the embodiment of the present invention are now described.

Figure 6:
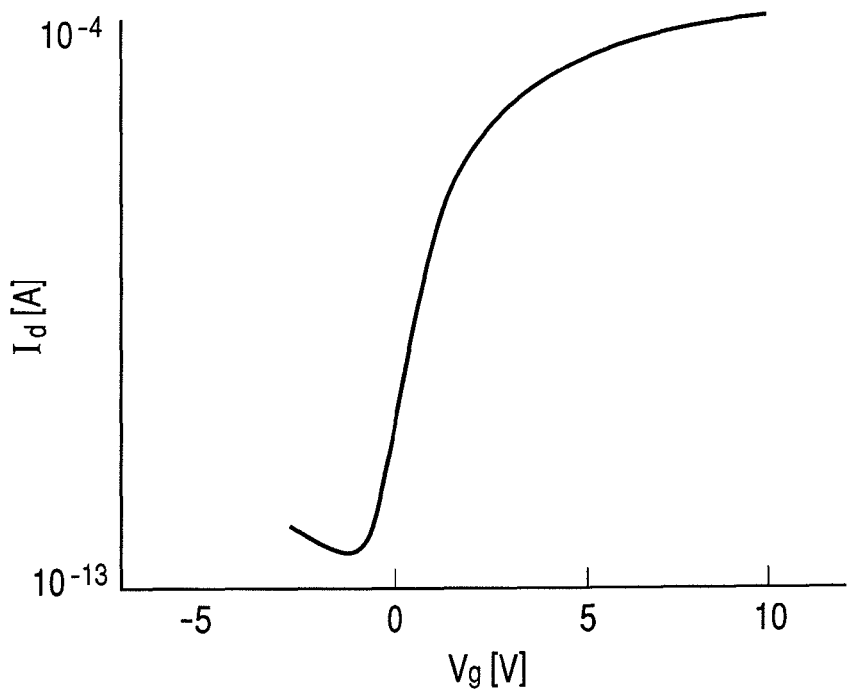
FIG. 6 is a graph illustrating typical TFT characteristics of a thin film transistor as an embodiment of the present invention.

First, evaluation indicators of the transistor operation characteristics are described. FIG. 6 illustrates typical characteristics of a thin film transistor according to this embodiment. When a voltage Vd of about 6 V is applied between the source electrode and the drain electrode, by switching a gate voltage Vg between −3 V and 10 V, a current Id between the source electrode and the drain electrode can be controlled (switched on/off).

There are various evaluation items for the transistor characteristics including the field-effect mobility and the current on/off ratio. The field-effect mobility can be determined from characteristics in a linear region or a saturation region. For example, a graph of √Id–Vg is prepared from the result of the transfer characteristics, and the field-effect mobility is derived from the slope of the graph. The evaluation herein is made by this method unless otherwise stated. The current on/off ratio can be determined from the ratio of the largest Id to the smallest Id in the transfer characteristics.

Figure 8:
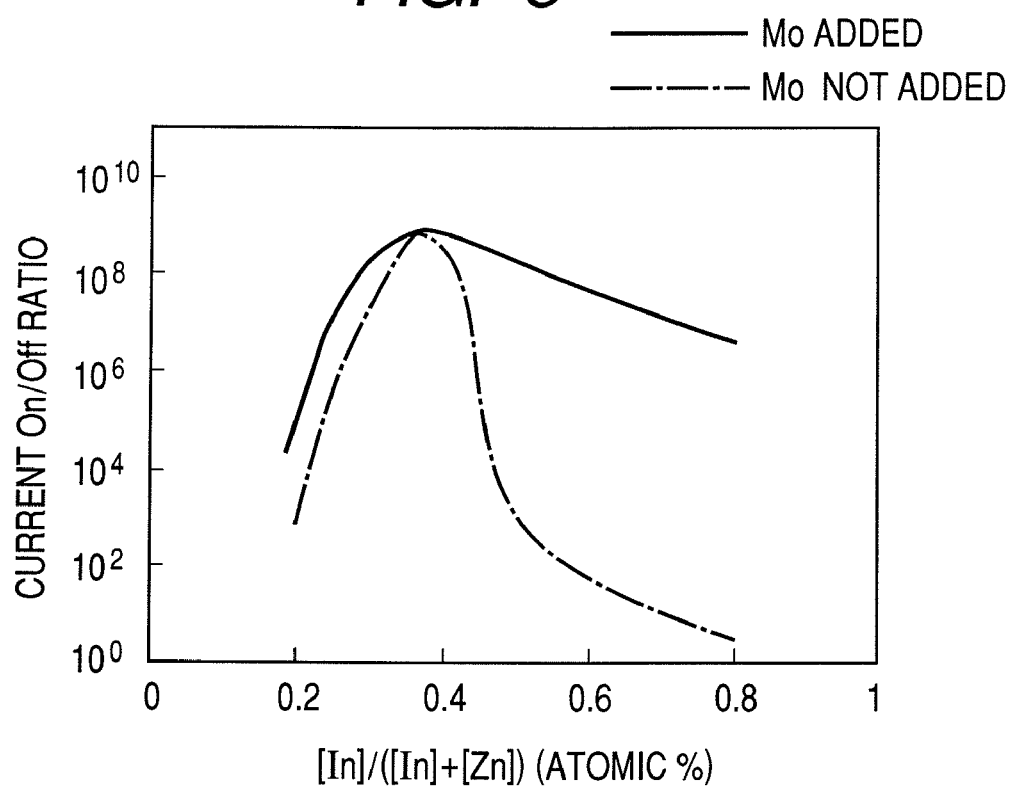
FIG. 8 is a graph of current on/off ratio which is plotted against atomic composition ratio of In with regard to a TFT manufactured according to Example 1 which is left at rest for half a year in an atmosphere at a temperature of 20° C. and at a humidity of 50%.

It can be seen that, compared with a conventional TFT in which In—Ga—Zn—O is used as the active layer (field-effect mobility: about 6 to 9 cm²/Vs, S value: about 2 V/decade), the TFT of this embodiment has a higher field-effect mobility and a smaller S value. Further, the TFT of this embodiment has a larger design range of the atomic composition ratio of a metallic element (range of atomic composition ratio applicable to transistor). Specifically, as illustrated in FIG. 8, with regard to a TFT in which In—Zn—O with Mo added thereto is used as the active layer, a current on/off ratio of $10^5$ or higher can be obtained when the atomic composition ratio of In expressed as In/(In+Zn) is in the range of from 30 atom % to 80 atom %. According to findings by the inventors of the present invention, as the resistivity of the oxide semiconductor becomes higher, the off-current becomes smaller. Therefore, one reason for the above-mentioned enlargement of the design range of the composition by the addition of Mo is thought to be suppression of variations (lowering) over time of the resistance in the In-rich region (In: 45 atom % or higher) and in the Zn-rich region (In: 35 atom % or lower) in each of which the environmental stability is low. Further, it is observed that, when the composition is such that In is 30 atom % or lower, the on-current greatly decreases, and, as a result, the current on/off ratio becomes smaller. Here, the film is polycrystallized, and hence the above-mentioned decrease in on-current is thought to be due to lowered field-effect mobility which is in turn due to decrease in interface characteristics.

While a conventional TFT using In—O is characterized by a high mobility and a low environmental stability, the TFT of this embodiment exhibits at all times excellent characteristics with stability, and the TFT characteristics vary only a little from immediately after the manufacture to after the TFT is left at rest in the atmosphere for a month.

By connecting the drain electrode which is an output terminal of the field effect transistor of this embodiment to an electrode of a display device such as an organic or inorganic electroluminescence (EL) device or a liquid crystal device, a display apparatus can be formed. An exemplary specific structure of a display apparatus is described in the following with reference to sectional views of the display apparatus.

Figure 10:
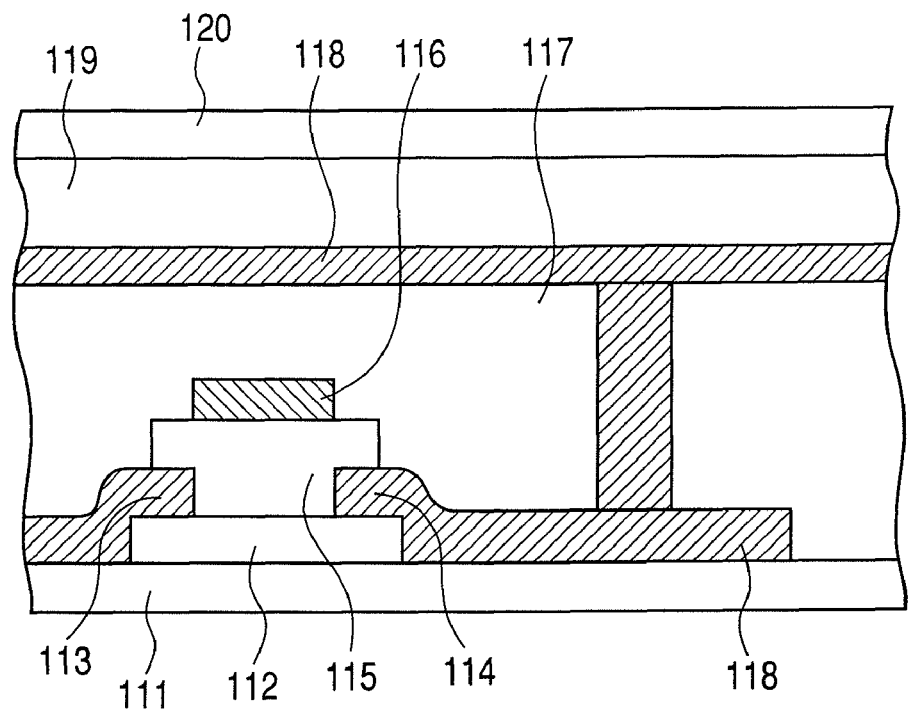
FIG. 10 is a schematic sectional view of a display apparatus as an embodiment of the present invention.

For example, as illustrated in FIG. 10, a field effect transistor is formed on a base 111. The field effect transistor includes an active layer (channel layer) 112, a source electrode 113, a drain electrode 114, a gate insulating film 115, and a gate electrode 116. An electrode 118 is connected to the drain electrode 114 via an interlayer insulating layer 117. The electrode 118 is brought into contact with a light-emitting layer 119, and the light-emitting layer 119 is brought into contact with an electrode 120. This structure enables control of current which flows in the light-emitting layer 119 by current which flows from the source electrode 113 to the drain electrode 114 via a channel formed in the active layer 112. Therefore, current which flows in the light-emitting layer 119 can be controlled by voltage at the gate electrode 116 of the field effect transistor. Here, the electrode 118, the light-emitting layer 119, and the electrode 120 form an inorganic or organic electroluminescence device.

Figure 11:
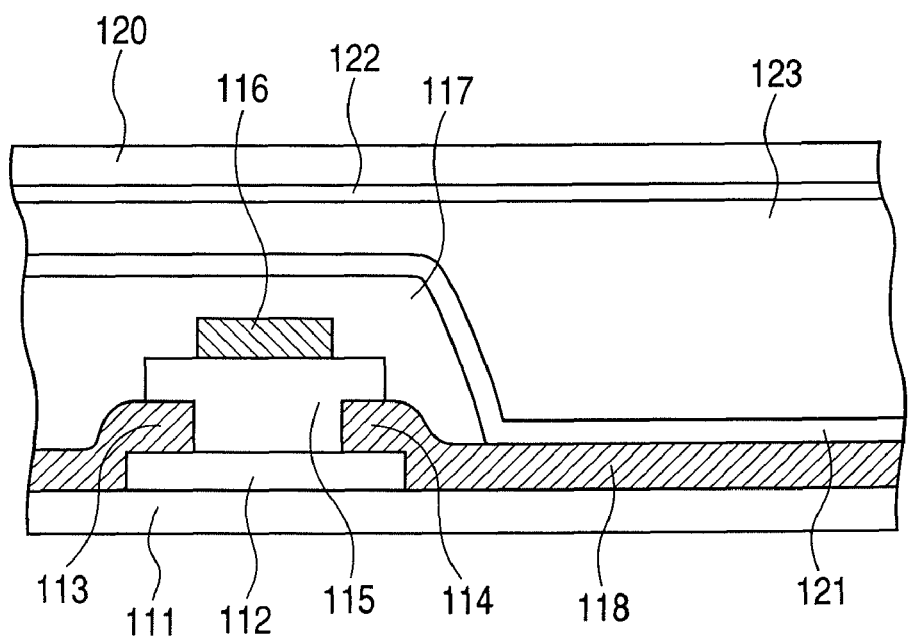
FIG. 11 is a schematic sectional view of a display apparatus as another embodiment of the present invention.

Alternatively, as illustrated in FIG. 11, the structure may be such that the drain electrode 114 is extended so as to also serve as the electrode 118 for applying voltage to a liquid crystal cell or electrophoretic particle cell 123 sandwiched between high-resistance films 121 and 122. The liquid crystal cell or the electrophoretic particle cell 123, the high-resistance films 121 and 122, the electrode 118, and the electrode 120 form a display device. Voltage applied to the display device can be controlled by the current which flows from the source electrode 113 to the drain electrode 114 via the channel formed in the active layer 112. Therefore, voltage applied to the display device can be controlled by voltage at the gate electrode 116 of the TFT. Here, when a display medium of the display device is a capsule in which a fluid and particles are encapsulated in an insulating film, the high-resistance films 121 and 122 are not necessary.

In the above-mentioned two examples, the thin film transistor is represented by a thin film transistor of a staggered structure (top-gate structure), but the present invention is not limited thereto. For example, insofar as the connection between the drain electrode as an output terminal of the thin film transistor and the display device is topologically identical, other structures such as a coplanar type are also possible.

Further, in the above-mentioned two examples, the pair of electrodes for driving the display device are provided in parallel with the base, but this embodiment is not limited thereto. For example, insofar as the connection between the drain electrode as an output terminal of the thin film transistor and the display device is topologically identical, any one or both of the electrodes may be provided so as to be perpendicular to the base.

Here, when the pair of electrodes for driving the display device are provided in parallel with the base, if the display device is an EL device or a reflection type display device such as a reflection type liquid crystal device, any one of the electrodes is required to be transparent to the wavelength of emitted light or reflected light. Alternatively, if the display device is a transmission type display device such as a transmission type liquid crystal device, both of the electrodes are required to be transparent to transmitted light.

Further, in the thin film transistor of this embodiment, it is also possible to make transparent all the constituents, which enables formation of a transparent display device. Further, such a display device can be provided on a base having low heat resistance such as a plastic substrate made of resin that is lightweight, flexible, and transparent.

Next, a display apparatus in which multiple pixels including an EL device (here, organic EL device) and a field effect transistor are two-dimensionally arranged is described with reference to FIG. 12.

Figure 12:
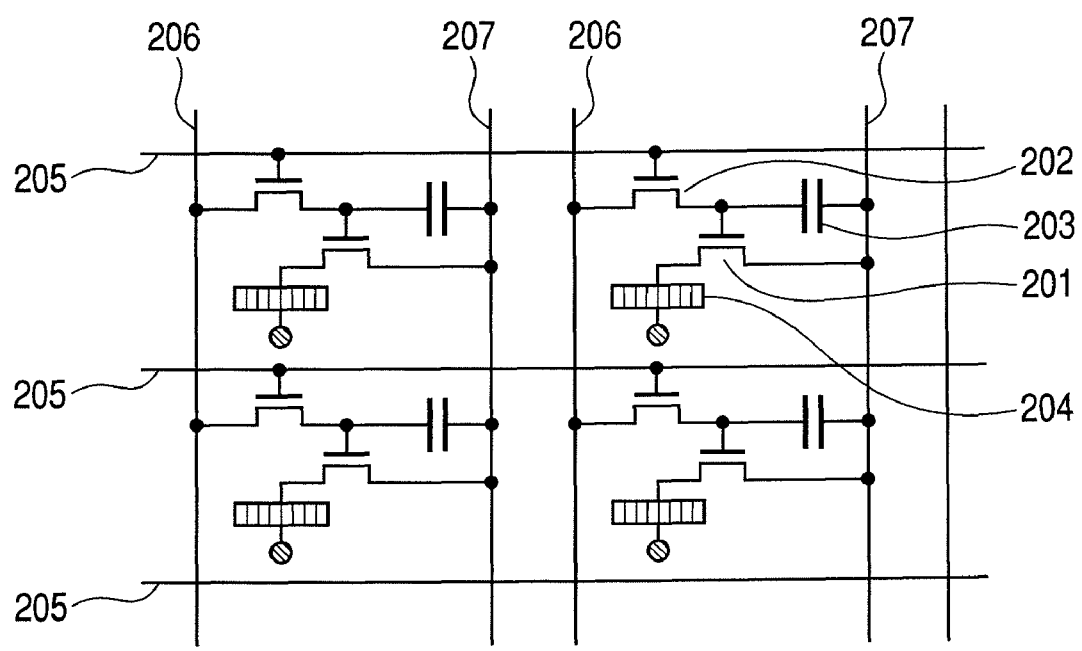
FIG. 12 schematically illustrates a structure of a display apparatus in which pixels including an organic EL device and a thin film transistor are two-dimensionally arranged.

FIG. 12 illustrates a transistor 201 for driving an organic EL layer 204 and a transistor 202 for selecting a pixel. A capacitor 203 is for holding a selected state, and charge is accumulated between a common electrode line 207 and a source portion of the transistor 202 and a signal at a gate of the transistor 201 is held. A pixel is selected by a scanning electrode line 205 and a signal electrode line 206.

More specifically, an image signal is applied as a pulse signal from a driver circuit (not shown) via the scanning electrode line 205 to a gate electrode. At the same time, a pulse signal is applied from another driver circuit (not shown) via the signal electrode line 206 to the transistor 202 to select a pixel. Here, the transistor 202 is turned ON, and charge is accumulated in the capacitor 203 disposed between the common electrode line 207 and the source of the transistor 202. This makes the gate voltage of the transistor 201 held at a desired voltage and the transistor 201 is turned ON. This state is held until a next signal is received. During the time period in which the transistor 201 is ON, voltage and current continue to be supplied to the organic EL layer 204 to maintain light emission.

In the example illustrated in FIG. 12, two transistors and one capacitor are included in one pixel, but an additional transistor and the like may be incorporated therein to improve the performance.

EXAMPLES

Examples of the present invention are described in the following, but the present invention is not limited thereto.

Example 1

A first example of a TFT device according to the present invention is now described with reference to FIG. 4.

In this example, ITO was used as the gate electrode 15 and a silicon oxide film at a thickness of about 150 nm was used as the gate insulating film 14. The substrate was a glass substrate, and an In—Zn—O film with Mo added thereto was formed on the glass substrate as the active layer 11.

It is to be noted that, in this example, in order to review the dependence of the active layer on atomic composition ratio, a combinatorial method was used to form the film. Specifically, a technique in which a thin film of an oxide having various kinds of composition was manufactured on one substrate at a time by the sputtering method was used. However, it is not necessary to use this technique at any time. A material source (target) of predetermined composition may be prepared to form a thin film formed of an amorphous oxide, or, by controlling power applied to each of multiple targets, a thin film of a desired kind of composition may be formed.

The In—Zn—O film with Mo added thereto was formed using a co-sputtering apparatus with diagonal incidence configuration. The target was disposed obliquely with respect to the substrate. The composition of the film on the surface of the substrate varied depending on the distance from the target, and hence a thin film having a wide composition distribution of the ternary elements across the surface of the substrate could be obtained. As the target (material source), a 2-inch sintered body with ZnO composition, a 2-inch sintered body with $In_2O_3$ composition, and a 2-inch sintered body with $MoO_3$ composition (each at purity of 99.9%) were used. The applied RF power was 45 W with respect to ZnO, 35 W with respect to $In_2O_3$, and 11 W with respect to $MoO_3$. It is to be noted that the distance between the target and the substrate was about 7 to 12 cm, and the temperature of the substrate when the film was formed was 25° C. The In—Zn—O film with Mo added thereto was formed in an atmosphere of argon-oxygen mixed gas at $4\times10^{-1}$ Pa with the partial pressure of introduced oxygen being $6\times10^{-3}$ Pa.

After that, the sputtering method was used to form an ITO layer at a thickness of about 150 nm from a side nearer to the oxide semiconductor active layer, and, by a photolithography method and a lift-off method, the source electrode 12 and the drain electrode 13 were formed. Finally, an $SiO_2$ film used as the gate insulating film 14 was formed by an RF sputtering method at a thickness of about 200 nm, on which an ITO film was formed at a thickness of about 150 nm, and the gate electrode 15 was formed by the photolithography method and the lift-off method. The channel length was 10 μm and the channel width was 150 μm.

Next, with respect to the TFT manufactured according to the above-mentioned method, heat treatment was carried out in an atmosphere at 300° C. for an hour. Measurement with a profilometer was carried out with respect to the finally obtained In—Zn—O film with Mo added thereto. The film thickness was about 25 nm. Further, X-ray fluorescence analysis revealed that the atomic composition ratio of In to the number of all In and Zn atoms, In/(Zn+In), was 15 to 80 atom %. ICP optical emission spectroscopy revealed that the atomic composition ratio of Mo to the number of all metallic atoms, Mo/(In+Zn+Mo), was about 0.1 to 7 atom %.

Further, X-ray diffraction was measured under the condition that the incident angle on the film surface was 0.5 degrees. When the atomic composition ratio of Zn (Zn/(In+Zn+Mo)) was 70 atom % or lower, no clear diffraction peak was detected, and it was confirmed that the manufactured film was amorphous. On the other hand, when the atomic composition ratio of Zn, Zn/(In+Zn+Mo), was 70 atom % or higher, a diffraction peak of $Zn_kIn_2O_{k+3}$ was detected, and it was confirmed that the manufactured film was crystallized.

Comparative Example 1

The structure was the same as that of the above-mentioned Example 1 except for the active layer. In this comparative example, an In—Zn—O film without Mo added thereto was formed as the active layer 11. It is to be noted that, in this comparative example, also, in order to review the dependence of the material of the active layer on atomic composition ratio, the combinatorial method was used to form the film.

The In—Zn—O film was formed in an atmosphere of argon-oxygen mixed gas at $4\times10^{-1}$ Pa with the partial pressure of introduced oxygen being $6\times10^{-3}$ Pa. Other conditions for film formation were the same as those of Example 1. Measurement with a profilometer was carried out with respect to the finally obtained oxide film. The film thickness was about 25 nm. Further, X-ray fluorescence analysis was carried out, and the atomic composition ratio of In, In/(Zn+In), was 15 to 80 atom %. With regard to evaluation of the amount of Mo in the film, ICP optical emission spectroscopy revealed that the amount of Mo was less than the detection limit.

Further, X-ray diffraction was measured under the condition that the incident angle on the film surface was 0.5 degrees. When the atomic composition ratio of Zn, Zn/(In+Zn), was 70 atom % or higher, no clear diffraction peak was detected, and it was confirmed that the manufactured film was amorphous. On the other hand, when the atomic composition ratio of Zn, Zn/(In+Zn), was 70 atom % or lower, a diffraction peak of $Zn_kIn_2O_{k+3}$ was detected, and it was confirmed that the manufactured film was crystallized.

Comparative Example 2

The structure was the same as that of the above-mentioned Example 1 except for the active layer. In this comparative example, an In—Zn—O film with Mo added thereto was formed as the active layer 11, but the atomic composition ratio of Mo to the number of all metallic atoms was 0.01 to 0.05 atom %. It is to be noted that, in this comparative example, also, in order to review the dependence of the material of the active layer on atomic composition ratio, the combinatorial method was used to form the film.

As the target (material source), a 2-inch sintered body with ZnO composition, a 2-inch sintered body with $In_2O_3$ composition, and a 2-inch sintered body with $MoO_3$ composition (each at purity of 99.9%) were used. The applied RF power was 80 W with respect to ZnO, 60 W with respect to $In_2O_3$, and 5 W with respect to $MoO_3$. It is to be noted that the distance between the target and the substrate was about 7 to 12 cm, and the temperature of the substrate when the film was formed was 25° C. The In—Zn—O film with Mo added thereto was formed in an atmosphere of argon-oxygen mixed gas at $4\times10^{-1}$ Pa with the partial pressure of introduced oxygen being $6\times10^{-3}$ Pa. Other conditions for film formation were the same as those of Example 1. Measurement with a profilometer was carried out with respect to the finally obtained oxide film. The film thickness was 25 nm. Further, X-ray fluorescence analysis was carried out, and the atomic composition ratio of In, In/(Zn+In), was 15 to 80 atom %. With regard to evaluation of the amount of Mo in the film, ICP optical emission spectroscopy revealed that the atomic composition ratio of Mo to the number of all metallic atoms Mo/(In+Zn+Mo) was about 0.01 to 0.05 atom %.

Further, X-ray diffraction was measured under the condition that the incident angle on the film surface was 0.5 degrees. When the atomic composition ratio of Zn, Zn/(In+Zn), was 70 atom % or higher, no clear diffraction peak was detected, and it was confirmed that the manufactured film was amorphous. On the other hand, when the atomic composition ratio of Zn, Zn/(In+Zn), was 70 atom % or lower, a diffraction peak of $Zn_kIn_2O_{k+3}$ was detected, and it was confirmed that the manufactured film was crystallized.

(Comparative Evaluation of Example 1 and Comparative Examples 1 and 2)

With regard to the In—Zn—O active layer with Mo added thereto obtained in Example 1, the optical absorption spectrum was analyzed. Band gap of the above-mentioned oxide film with Mo added thereto was about 2.7 to 2.9 eV depending on the atomic composition ratio of In, which is substantially the same as those of the In—Zn—O film of Comparative Example 1 and the In—Zn—O film with Mo added thereto of Comparative Example 2.

Figure 7:
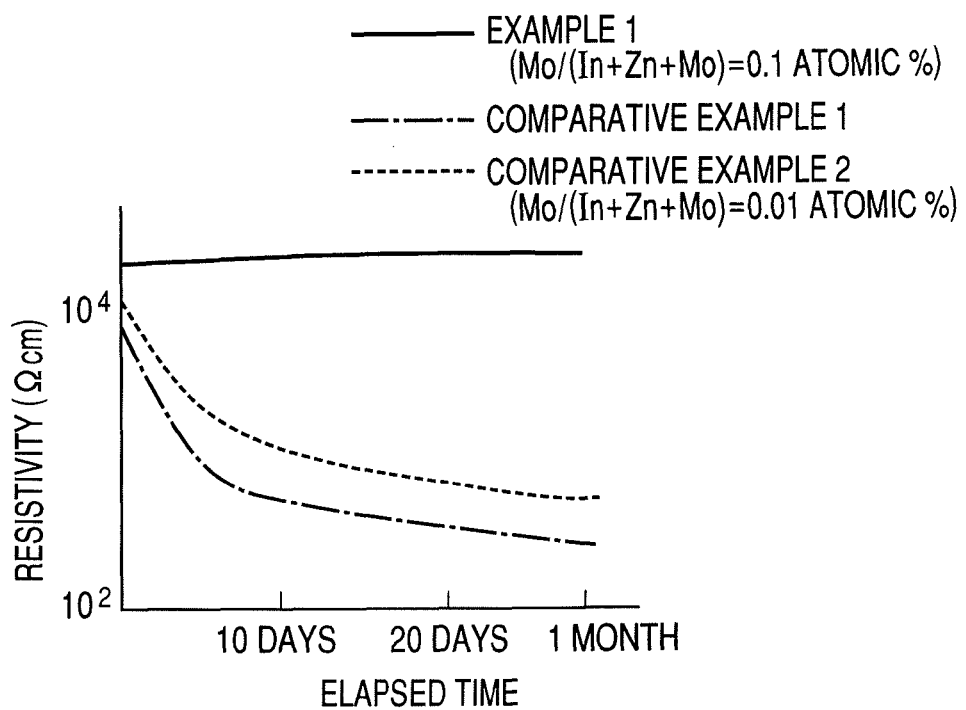
FIG. 7 is a graph illustrating variations over time of the resistivity of an oxide film manufactured according to Example 1 which is left in an atmosphere at a temperature of 20° C. and at a humidity of 50%.

Next, in order to review the stability over time of the In—Zn—O film with Mo added, the oxide films manufactured in Example 1 and Comparative Examples 1 and 2 were left at rest in an atmosphere at a temperature of 20° C. and at a humidity of 50%, and the variations over time of the resistivity were measured. With regard to the oxide films of Comparative Examples 1 and 2, after being left at rest for a month, the resistivity decreased substantially by an order to two orders of magnitude depending on the atomic composition ratios of In and Zn, while, with regard to the In—Zn—O film with Mo added thereto of Example 1, decrease in resistivity was not observed, and it was found that the film had excellent environmental stability. FIG. 7 illustrates variations over time of the resistivity of the oxide films obtained in Example 1 and Comparative Examples 1 and 2 when the atomic composition ratio of In, In/(Zn+In), is 50 atom %.

As described above, by adding an appropriate amount of Mo to the In—Zn—O film, a semiconductor having environmental stability can be materialized.

Figure 9:
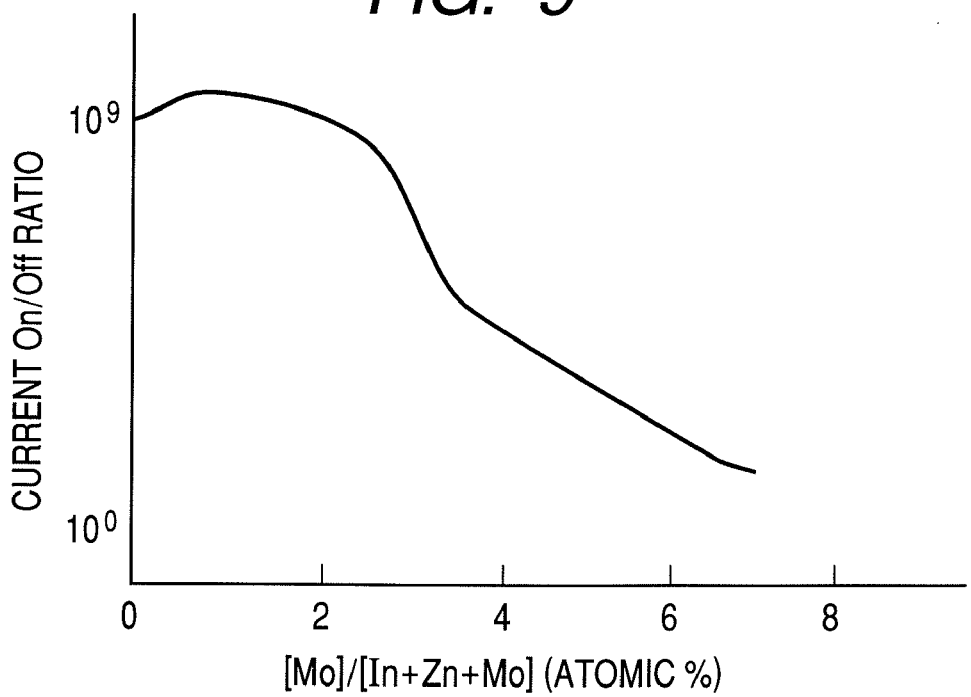
FIG. 9 is a graph of current on/off ratio of the TFT which is plotted against atomic composition ratio of Mo when the atomic composition ratio of In, In/(Zn+In), is 50 atom %.

In Example 1, satisfactory transistor characteristics were obtained when the atomic composition ratio of Mo to the number of all metallic atoms was 5 atom % or lower. FIG. 9 illustrates current on/off ratio of the TFT which is plotted against atomic composition ratio of Mo when the atomic composition ratio of In, In/(Zn+In), is 50 atom %. When the atomic composition ratio of Mo to the number of all metallic atoms was 5 atom % or lower, independently of the atomic composition ratios of In and Zn, the value of the current on/off ratio was a three-digit number or more. The most satisfactory transistor characteristics were obtained when the atomic composition ratio of Mo to the number of all metallic atoms was about 0.1 to 3 atom % and when the atomic composition ratio of In expressed as In/(Zn+In) was about 30 to 80 atom %. Here, as illustrated in FIG. 8, the obtained current on/off ratio was $10^5$ or larger. On the other hand, when the atomic composition ratio of In was 30 atom % or lower, the on-current was observed to greatly decrease, and, as a result, the current on/off ratio became smaller. Here, the film was polycrystallized, and hence the above-mentioned decrease in on-current is thought to be due to lowered field-effect mobility which is in turn due to decrease in interface characteristics. FIG. 6 illustrates the result of measurement at room temperature with regard to a TFT device obtained when the atomic composition ratio of Mo to the number of all metallic atoms was about 0.1 to 3 atom % and when the atomic composition ratio of In expressed as In/(Zn+In) was about 30 to 80 atom %. Here, Id-Vg characteristics (transfer characteristics) when Vd=6 V were illustrated. In the range of the above-mentioned composition, independently of the atomic composition ratios of the metals, substantially similar characteristics were obtained. For example, with regard to the on-current, when Vg=10 V, it was found that current Id as large as about $5\times10^{-4}$ A flowed. The off-current Id was about $8\times10^{-13}$ A and the threshold voltage was about 1.5 V. When the field-effect mobility was calculated from the output characteristics, in a saturation region, a value of about 15 $cm^2$/Vs was obtained. The S value was about 0.3 V/dec.

On the other hand, it was found that the characteristics of the TFT devices manufactured in Comparative Examples 1 and 2 varied greatly depending on the atomic composition ratios of In and Zn in the oxide film. In both of Comparative Examples 1 and 2, the most satisfactory transistor characteristics were obtained when the atomic composition ratio of In expressed as In/(Zn+In) was about 40 atom %. Here, the mobility and the S value were about 16 cm$^2$/Vs and 17 cm$^2$/Vs, and about 0.16 V/dec and −0.2 V/dec, respectively. However, increase in off-current as the atomic composition ratio of In became higher was observed, and it was found that, when the atomic composition ratio of In expressed as In/(Zn+In) substantially exceeded 55 atom %, the value of the current on/off ratio became smaller than three-digit numbers. In this way, it was found that the TFTs in Comparative Examples 1 and 2 had smaller design ranges of the atomic composition ratios of In and Zn (range of atomic composition ratios applicable to transistor). FIG. 8 is a graph of TFT current on/off ratios with regard to Example 1 and Comparative Example 1. It is to be noted that the graph with regard to Example 1 of FIG. 8 was based on data obtained when the atomic composition ratio of Mo to the number of all metallic atoms was 0.1 atom %. As is clear from this figure, the current on/off ratio in Example 1 is extremely stable compared with that in Comparative Example 1.

Next, in order to review the stability over time of the TFT devices, the TFT devices were left at rest in an atmosphere at a temperature of 20° C. and at a humidity of 50%, and the variations over time of the TFT characteristics were measured. The result was that, with regard to the TFT manufactured in Example 1, even after being left at rest for a month, variations in characteristics were not observed, and it was found that the TFT had excellent environmental stability. On the other hand, with regard to the TFTs manufactured in Comparative Examples 1 and 2, depending on the atomic composition ratios of In and Zn, the threshold voltages changed to the negative side by about 0.5 V to 2 V. Further, in the In-rich region, increase in off-current was observed, and, as a result, it was found that the current on/off ratio decreased by an order to two orders of magnitude.

As described above, by using the In—Zn—O film with an appropriate amount of Mo added thereto as the active layer, a TFT device which has excellent transistor characteristics including an excellent mobility and an excellent S value, excellent environmental stability, and a high margin of atomic composition ratios (degree of freedom of design) can be materialized.

Example 2

A second example of a TFT device according to the present invention is now described with reference to FIG. 4. In this example, an In—Zn—Ga—O film was used as the active layer.

In this example, Mo was used as the gate electrode 15 and a silicon oxide film at a thickness of about 150 nm was used as the gate insulating film 14. The substrate was a glass substrate, and the In—Zn—Ga—O film with Mo added thereto was formed on the glass substrate as the active layer 11.

The In—Zn—Ga—O film was formed using a co-sputtering apparatus with diagonal incidence configuration. In this example, there were three elements of In$_2$O$_3$, ZnO, and Ga$_2$O$_3$ in forming the film, and hence an In—Zn—Ga—O thin film having a Ga atomic composition ratio distribution of 1 atom % or higher and 10 atom % or lower in one substrate surface could be obtained. Further, here, a Ga concentration distribution was formed in a direction orthogonal to the composition slope of In—Zn.

As the target (material source), a 2-inch sintered body with ZnO composition, a 2-inch sintered body with In$_2$O$_3$ composition, and a 2-inch sintered body with Ga$_2$O$_3$ composition (each at purity of 99.9%) were used. The applied RF power was 50 W with respect to ZnO, 30 W with respect to In$_2$O$_3$, and 10 W with respect to Ga$_2$O$_3$. The In—Zn—Ga—O film was formed in an atmosphere of argon-oxygen mixed gas at $4\times10^{-1}$ Pa with the partial pressure of introduced oxygen being $1\times10^{-3}$ Pa. Further, after the In—Zn—Ga—O film was formed, Mo ions were implanted to add Mo.

After that, the sputtering method was used to form an ITO layer at a thickness of about 150 nm from a side nearer to the semiconductor active layer formed of the amorphous oxide. Then, by a photolithography method and a lift-off method, the source electrode 12 and the drain electrode 13 were formed. Finally, an SiO$_2$ film used as the gate insulating film 14 was formed by an RF sputtering method at a thickness of about 200 nm, on which an ITO film was formed at a thickness of about 150 nm, and the gate electrode 15 was formed by the photolithography method and the lift-off method. The channel length was 10 μm and the channel width was 150 μm.

Next, with respect to the TFT manufactured according to the above-mentioned method, heat treatment was carried out in an atmosphere at 300° C. for an hour. Measurement with a profilometer was carried out with respect to the finally obtained In—Zn—Ga—O film. The film thickness was about 25 nm. Further, X-ray fluorescence analysis and ICP optical emission spectroscopy revealed that the atomic composition ratio of In, In/(In+Zn), was 15 to 80 atom %, and the atomic composition ratio of Mo to the number of all metallic atoms was 0.1 atom %, respectively. Further, it was found that the atomic composition ratio of Ga to all the atoms was about 1 to 10 atom %.

Further, X-ray diffraction was measured under the condition that the incident angle on the film surface was 0.5 degrees. When the atomic composition ratio of Zn, Zn/(In+Zn+Ga), was about 70 atom % or lower, no clear diffraction peak was detected, and it was confirmed that the manufactured film was amorphous. On the other hand, when the atomic composition ratio of Zn, Zn/(In+Zn+Ga), was about 70 atom % or higher, a diffraction peak of InGaZn$_k$O$_{k+3}$ was detected, and it was confirmed that the manufactured film was crystallized.

Comparative Example 3

The structure was the same as that of the above-mentioned Example 2 except for the active layer. In this comparative example, an In—Zn—Ga—O film without Mo added thereto was formed as the active layer 11. In this comparative example, also, in order to review the dependence of the material of the active layer on atomic composition ratio, the combinatorial method was used to form the film.

The In—Zn—Ga—O film was formed in an atmosphere of argon-oxygen mixed gas at $4\times10^{-1}$ Pa with the partial pressure of introduced oxygen being $1.5\times10^{-3}$ Pa. It is to be noted that, in this comparative example, Mo was not introduced to the oxide film by ion implantation. Other conditions for film formation were the same as those of Example 2. Measurement with a profilometer was carried out with respect to the finally obtained oxide film. The film thickness was about 25 nm. Further, X-ray fluorescence analysis was carried out, and the atomic composition ratio of In, In/(Zn+In), was 15 to 80 atom %. Further, it was found that the atomic composition ratio of Ga to all the atoms was about 1 to 10 atom %. With regard to evaluation of the amount of Mo in the film, ICP optical emission spectroscopy revealed that the amount of Mo was less than the detection limit.

Further, X-ray diffraction was measured under the condition that the incident angle on the film surface was 0.5 degrees. When the atomic composition ratio of Zn, Zn/(In+Zn+Ga), was about 70 atom % or lower, no clear diffraction peak was detected, and it was confirmed that the manufactured film was amorphous. On the other hand, when the atomic composition ratio of Zn, Zn/(In+Zn+Ga), was about 70 atom % or higher, a diffraction peak of $InGaZn_kO_{k+3}$ was detected, and it was confirmed that the manufactured film was crystallized.

(Comparative Evaluation of Example 2 and Comparative Example 3)

With regard to the In—Zn—Ga—O active layer with Mo added thereto obtained in Example 2, the optical absorption spectrum was analyzed. Band gap of the above-mentioned oxide film with Mo added thereto was about 3 eV to 3.2 eV depending on the atomic composition ratio of a metal, which is higher than that of the In—Zn—O film with Mo added thereto of Example 1 and substantially the same as that of the In—Zn—Ga—O film of Comparative Example 3.

Next, in order to review the stability over time of the In—Zn—Ga—O film, the oxide film with Mo added thereto manufactured in Example 2 and the oxide film manufactured in Comparative Example 3 were left at rest in an atmosphere at a temperature of 20° C. and at a humidity of 50%, and the variations over time of the resistivity were measured. The result was that, with regard to the In—Zn—Ga—O film with Mo added thereto in Example 2, variations in resistivity were not observed, and it was found that the In—Zn—Ga—O film had excellent environmental stability. On the other hand, with regard to the In—Zn—Ga—O film in Comparative Example 3, compared with the In—Zn—O film in Comparative Example 1, the variations over time were small, and it was confirmed that introduction of Ga into the film was effective in improving the environmental stability. However, depending on the atomic composition ratio of Ga, decrease in resistivity by about ½ to one order of magnitude was observed, and it was found that, with regard to the environmental stability, the oxide film with Mo added thereto in Example 2 was more excellent.

In this way, by using the In—Zn—Ga—O film with Mo added thereto, a semiconductor which is highly transparent to visible light and which has high environmental stability can be materialized.

Further, in Example 2, the most satisfactory transistor characteristics were obtained when the atomic composition ratio of Ga, Ga/(In+Ga+Zn), was 1 atom % and when the atomic composition ratio of In expressed as In/(Zn+In) was about 30 to 80 atom %. In the range of the above-mentioned composition, independently of the atomic composition ratios of the metals, substantially similar characteristics were obtained. For example, with regard to the on-current, when Vg=10 V, it was found that current Id as large as about $3.5\times10^{-4}$ A flowed. The off-current Id was about $1\times10^{-14}$ A and the threshold voltage was about 1.8 V. When the field-effect mobility was calculated from the output characteristics, in a saturation region, a value of about 13 $cm^2/Vs$ was obtained. The S value was about 0.4 V/dec.

Further, as the atomic composition ratio of Ga became higher, the field-effect mobility was observed to be lowered and the S value was observed to increase. However, even when the atomic composition ratio of Ga, Ga/(In+Ga+Zn), was 10 atom %, the field-effect mobility was 10 $cm^2/Vs$ and the S value was 0.8 V/sec, which were relatively satisfactory values. Further, it was found that, here, the atomic composition ratio of In expressed as In/(Zn+In) when the transistor operated satisfactorily was about 26 atom % or higher and 83 atom % or lower, which is a wide range.

On the other hand, with regard to the TFT device manufactured in Comparative Example 3, the most satisfactory transistor characteristics were obtained when the atomic composition ratio of In expressed as In/(Zn+In) was about 40 atom %. Here, depending on the atomic composition ratio of Ga, the mobility and the S value were about 11 to 13 $cm^2/Vs$, and about 0.2 to 0.6 V/dec, respectively. However, increase in off-current with an increase in the atomic composition ratio of In was observed. For example, it was found that when the atomic composition ratio of Ga expressed as Ga/(In+Ga+Zn) was 10 atom %, and when the atomic composition ratio of In expressed as In/(Zn+In) substantially exceeded 63 atom %, the value of the current on/off ratio became smaller than three-digit numbers. In this way, it was found that the TFT in Comparative Example 3 had a smaller design range of the atomic composition ratio of In:Zn (range of atomic composition ratio applicable to transistor) compared with Example 2.

Next, in order to review the stability over time of the TFT devices, the TFT devices were left at rest in an atmosphere at a temperature of 20° C. and at a humidity of 50%, and the variations over time of the TFT characteristics were measured. The result was that, with regard to the TFT manufactured in Example 2, with respect to the TFTs having different atomic composition ratios of metals, even after being left at rest for a month, variations in characteristics were not observed, and it was found that the TFT had excellent environmental stability.

On the other hand, with regard to the TFT manufactured in Comparative Example 3, compared with the TFT in Comparative Example 1 in which In—Zn—O was used as the active layer, variations over time were small, and it was found that the TFT had excellent environmental stability. However, depending on the atomic composition ratio of Ga, the threshold voltage changed to the negative side by about 0.3 V to 1 V. Further, in the In-rich region, increase in off-current was observed, and, as a result, it was found that the current on/off ratio decreased by about one order of magnitude.

Further, with regard to TFT devices manufactured in Examples 1 and 2, variations in TFT characteristics when light from a fluorescent lamp was irradiated were reviewed. With regard to the TFT in Example 1, it was found that the off-current increased to some extent, and, as a result, the current on/off ratio decreased. On the other hand, with regard to the TFT in Example 2, it was found that variations in characteristics due to light irradiation from a fluorescent lamp were small, and, in particular, when the atomic composition ratio of Ga in the film was high, almost no variation of the characteristics was observed.

In this way, by using the In—Zn—Ga—O film with an appropriate amount of Mo added thereto as the active layer, a TFT device which has excellent transistor characteristics including an excellent mobility and an excellent S value, excellent environmental stability, and a high margin of atomic composition ratios (degree of freedom of design) can be materialized. Further, by selecting an appropriate concentration of Ga in the film, a TFT device which is highly transparent to visible light can be materialized.

Example 3

A TFT device having the same structure as that of the above-mentioned Example 2 except for the electrodes was manufactured. In this example, an Mo electrode at a thickness of about 100 nm formed by an electron beam deposition method was used as the gate electrode 15, the source electrode 12, and the drain electrode 13.

In this example, the most satisfactory transistor characteristics were obtained when the atomic composition ratio of Ga, Ga/(In+Ga+Zn), was 1 atom % and when the atomic composition ratio of In expressed as In/(Zn+In) was about 30 to 80 atom %. In the range of the above-mentioned composition, independently of the atomic composition ratios of the metals, substantially similar characteristics were obtained. For example, the on-current Id was, when Vg=10 V, about $4 \times 10^{-4}$ A, which was a larger value compared with the TFT in Example 2 in which the In—Zn—Ga—O film with Mo added thereto was used as the active layer. The reason is thought to be that, in this example, Mo was used as the electrodes, and hence the extent of electrical contact between the active layer and the electrodes was improved. The off-current Id was about $1 \times 10^{-14}$ A and the threshold voltage was about 1.8 V. When the field-effect mobility was calculated from the output characteristics, in a saturation region, a value of about 14 cm$^2$/Vs was obtained. The S value was about 0.4 V/dec.

Further, as the atomic composition ratio of Ga became higher, the field-effect mobility was observed to be lowered and the S value was observed to increase. However, even when the atomic composition ratio of Ga, Ga/(In+Ga+Zn), was 10 atom %, the field-effect mobility was 12 cm$^2$/Vs and the S value was 0.8 V/sec, which were relatively satisfactory values. Further, it was found that, here, the atomic composition ratio of In expressed as In/(Zn+In) when the transistor operates satisfactorily was as wide as about 26 atom % or higher and 83 atom % or lower.

In this way, by using the In—Zn—Ga—O film with an appropriate amount of Mo added thereto as the active layer and using Mo as the electrodes, a TFT device in which the extent of electrical contact between the active layer and the electrodes is large, and thus, which has excellent transistor characteristics including an excellent mobility can be materialized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-001336, filed Jan. 8, 2008, which is hereby incorporated by reference herein in its entirety.

The invention claimed is:

1. An amorphous oxide comprising:
   In—Ga—Zn—O with Mo added,
   wherein an atomic composition ratio of Mo to a number of all metallic atoms in the amorphous oxide is 0.1 atom % or higher and 5 atom % or lower, and
   wherein an atomic composition ratio of In to a sum of In and Zn, In/(In+Zn), in the In—Ga—Zn—O with Mo added is 30 atom % or higher and 80 atom % or lower.

2. An amorphous oxide according to claim 1, wherein the atomic composition ratio of Mo to the number of all metallic atoms in the amorphous oxide is 0.1 atom % or higher and 3 atom % or lower.

3. An amorphous oxide comprising:
   In—Ga—Zn—O with Mo added,
   wherein an atomic composition ratio of Mo to a number of all metallic atoms in the amorphous oxide is 0.1 atom % or higher and 5 atom % or lower, and
   wherein an atomic composition ratio of Zn to the number of all metallic atoms in the amorphous oxide is 70 atom % or lower.

4. A field effect transistor comprising:
   a drain electrode;
   a source electrode;
   a gate electrode;
   an active layer; and
   a gate insulating film,
   wherein said active layer comprises an amorphous oxide,
   wherein said amorphous oxide at least comprises:
      at least one element selected from the group consisting of In, Zn, and Sn; and
      Mo,
      wherein an atomic composition ratio of Mo to a number of all metallic atoms in said amorphous oxide is 0.1 atom % or higher and 5 atom % or lower.

5. A field effect transistor according to claim 4, wherein said source electrode and said drain electrode contain Mo.

6. In combination, a display apparatus and a field effect transistor according to claim 4, wherein said field effect transistor is incorporated in said display apparatus, wherein said display apparatus includes an electrode, and wherein one of said source electrode and said drain electrode of said field effect transistor is connected to said electrode of said display apparatus.

7. A combination according to claim 6, wherein said display apparatus includes an electroluminescence device.

8. A combination according to claim 6, wherein said display apparatus includes a liquid crystal cell.

9. A field effect transistor according to claim 4, wherein the atomic composition ratio of Mo to the number of all metallic atoms in said amorphous oxide is 0.1 atom % or higher and 3 atom % or lower.

10. A field effect transistor according to claim 4, wherein said amorphous oxide comprises In and Zn.

11. A field effect transistor according to claim 4, wherein said amorphous oxide further comprises Ga.

12. A field effect transistor according to claim 4, wherein an atomic composition ratio of In to a sum of In and Zn, In/(In+Zn), in said amorphous oxide is 30 atom % or higher and 80 atom % or lower.

13. A field effect transistor according to claim 4, wherein an atomic composition ratio of Zn to the number of all metallic atoms in said amorphous oxide is 70 atom % or lower.

14. A field effect transistor according to claim 4, wherein said source electrode and said drain electrode are provided over said active layer.

15. An amorphous oxide comprising:
   at least one element selected from the group consisting of In, Zn, and Sn; and
   Mo,
   wherein an atomic composition ratio of Mo to a number of all metallic atoms in said amorphous oxide is 0.1 atom % or higher and 5 atom % or lower,
   wherein a film comprising said amorphous oxide is a semiconductor film, and
   wherein said semiconductor film has an electrical resistivity of 1 Ωcm to 100 kΩcm.

16. An amorphous oxide according to claim 15, wherein the atomic composition ratio of Mo to the number of all metallic atoms in said amorphous oxide is 0.1 atom % or higher and 3 atom % or lower.

17. An amorphous oxide according to claim 15, wherein said amorphous oxide comprises In and Zn.

18. An amorphous oxide according to claim 15, wherein said amorphous oxide further comprises Ga.

19. An amorphous oxide according to claim 15, wherein an atomic composition ratio of In to a sum of In and Zn, In/(In+Zn), in said amorphous oxide is 30 atom % or higher and 80 atom % or lower.

20. An amorphous oxide according to claim 15, wherein an atomic composition ratio of Zn to the number of all metallic atoms in said amorphous oxide is 70 atom % or lower.

21. An amorphous oxide according to claim 3, wherein the atomic composition ratio of Mo to the number of all metallic atoms in the amorphous oxide is 0.1 atom % or higher and 3 atom % or lower.

* * * * *